United States Patent
Wang et al.

(10) Patent No.: US 11,740,277 B2
(45) Date of Patent: Aug. 29, 2023

(54) METHOD FOR TESTING LIGHT-EMITTING UNIT

(71) Applicants: Tsun-I Wang, Taoyuan (TW); Ching-Chun Wu, Taoyuan (TW); Chia-Liang Yang, Taoyuan (TW)

(72) Inventors: Tsun-I Wang, Taoyuan (TW); Ching-Chun Wu, Taoyuan (TW); Chia-Liang Yang, Taoyuan (TW)

(73) Assignee: Dynascan Technology Corp., Taoyuan (TW)

( * ) Notice: Subject to any disclaimer, the term of this patent is extended or adjusted under 35 U.S.C. 154(b) by 98 days.

(21) Appl. No.: 16/596,784

(22) Filed: Oct. 9, 2019

(65) Prior Publication Data

US 2020/0209304 A1 Jul. 2, 2020

(30) Foreign Application Priority Data

Dec. 26, 2018 (TW) .................. 107147114

(51) Int. Cl.
*G01R 31/26* (2020.01)
*H05B 45/14* (2020.01)
*H05B 45/58* (2020.01)
*H05B 45/22* (2020.01)
*H05B 45/20* (2020.01)
*H05B 45/10* (2020.01)

(52) U.S. Cl.
CPC ......... *G01R 31/2635* (2013.01); *H05B 45/14* (2020.01); *H05B 45/58* (2020.01)

(58) Field of Classification Search
CPC ........ H05B 45/22; H05B 45/20; H05B 45/10; H05B 45/14; H05B 45/48; H05B 47/19; H05B 45/375; H05B 45/395; H05B 45/00; H05B 45/12; H05B 45/24
See application file for complete search history.

(56) References Cited

U.S. PATENT DOCUMENTS

| | | | | |
|---|---|---|---|---|
| 5,699,103 | A * | 12/1997 | Fleming | B41J 2/45 347/240 |
| 2011/0007055 | A1* | 1/2011 | Wang | G09G 3/3426 345/211 |
| 2014/0055039 | A1* | 2/2014 | Huang | H05B 45/12 315/151 |

* cited by examiner

*Primary Examiner* — Wei (Victor) Y Chan

(57) ABSTRACT

To test a first LED, a second LED, and a third LED in a light-emitting unit, a method is disclosed herein comprising the following steps: setting the first and second LEDs in respective driven states to generate associated light; providing the third LED to receive the light associated with the first and second LEDs, thereby generating a first photocurrent and a second photocurrent; providing the first LED to receive the light associated with the second LED, thereby generating a third photocurrent; and calculating a decay factor of each of the LEDs based on the first, second, and third photocurrents.

5 Claims, 4 Drawing Sheets

METHOD FOR TESTING LIGHT-EMITTING UNIT

CROSS REFERENCE TO RELATED APPLICATION

The present application claims priority to Taiwan patent application Serial No. 107147114 filed on Dec. 26, 2018, the entire content of which is incorporated by reference to this application.

BACKGROUND OF THE INVENTION

1. Field of the Invention

The present invention pertains to a method for testing a light-emitting unit, and in particular to an auto-testing method of a light-emitting unit.

2. Description of the Prior Art

With the advance of semiconductor technology, light-emitting diodes (LEDs) can now be as miniscule as microns-wide while retaining their energy-saving, long-life, high-brightness, high-contrast properties. Makers after makers invested in LED technology, and LED displays of all sizes have come onto the market. Before shipping, such a display must undergo assorted test procedures to make sure every LED within works properly and the display itself is of certain quality.

For instance, it is conventional procedure to configure the display to render specific colors or patterns, and check the rendered result with a camera or an external device for light spots, dark spots, or other anomalies. The use of extra instruments in comparable procedures adds to the cost of manufacture and does not scale well when faced with a large batch of test subjects. To keep up with the market, the industry is in dire need of a method for swiftly testing LED displays without employing extra instruments.

SUMMARY OF THE INVENTION

The present invention exploits the device properties of light-emitting diodes (LEDs) to provide a method for testing a light-emitting unit. The method realizes auto-testing the light-emitting unit by making use of the LEDs therein.

The present invention discloses a method for testing a light-emitting unit. The light-emitting unit at least includes a first LED, a second LED, and a third LED. The method comprises the following steps. The first LED is set in a driven state to generate associated light. The second LED is also set in a driven state to generate associated light. The third LED is provided to receive the light associated with the first and second LEDs, thereby generating a first photocurrent and a second photocurrent. The first LED is provided to receive the light associated with the second LED, thereby generating a third photocurrent. Decay factors of the first, second, and third LEDs are then calculated based on the first, second, and third photocurrents.

In one embodiment, said method further comprises the steps of obtaining a fourth photocurrent, a fifth photocurrent, and a sixth photocurrent. The fourth photocurrent is associated with the third LED and with the light generated by the first LED. The fifth photocurrent is associated with the third LED and with the light generated by the second LED. The sixth photocurrent is associated with the first LED and with the light generated by the second LED. Moreover, the calculation of the decay factors of the first, second, and third LEDs is further based on the fourth, fifth, and sixth photocurrents.

The present invention exploits the device properties of LEDs to provide another method for testing a light-emitting unit. The method realizes auto-testing the light-emitting unit by making use of the LEDs therein.

The present invention discloses a method for testing at least one red LED, a green LED, and a blue LED in a light-emitting unit. The method comprises the following steps. The green LED and the blue LED are driven to generate a first green light and a first blue light. The red LED is provided to generate a first photocurrent based on the first green light and to generate a second photocurrent based on the first blue light. The green LED is provided to generate a third photocurrent based on the first blue light. Finally, the first, second, and third photocurrents are recorded.

In one embodiment, said method further comprises the following steps. After an elapse of time, the green LED and the blue LED are driven again to generate a second green light and a second blue light. The red LED is provided to generate a fourth photocurrent based on the second green light and to generate a fifth photocurrent based on the second blue light. The green LED is provided to generate a sixth photocurrent based on the second blue light. The fourth, fifth, and sixth photocurrents are then recorded. Moreover, a decay factor of the light emitting unit is calculated based on the first, second, third, fourth, fifth, and sixth photocurrents.

To summarize: The method provided by the present invention implements a light-emitting unit's auto-testing by making use of the LEDs therein; specifically, by measuring the photocurrents of some of the LEDs to determine the decay factors of others.

BRIEF DESCRIPTION OF THE APPENDED DRAWINGS

DETAILED DESCRIPTION OF THE INVENTION

The features, objectives, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
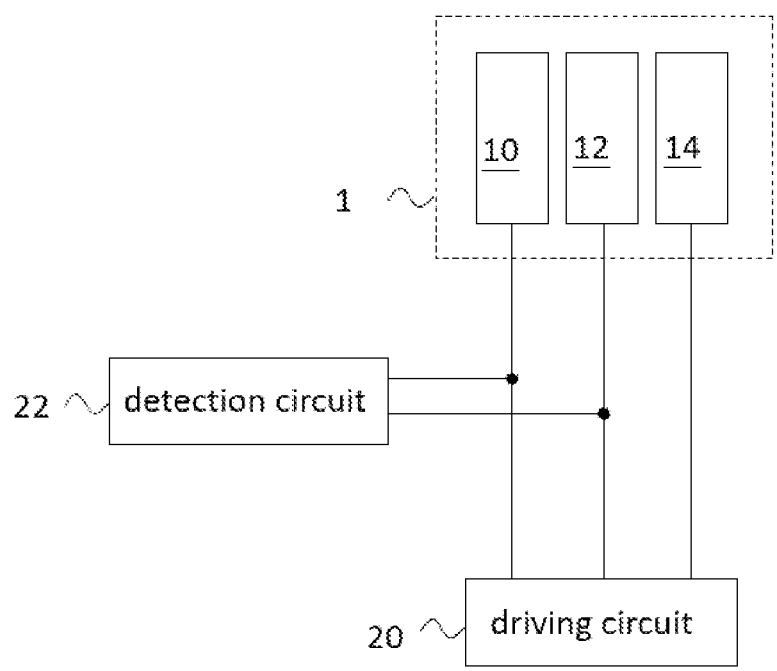
FIG. 1 is a block diagram of a device for testing a light-emitting unit, in accordance with an embodiment of the present invention.
Figure 2:
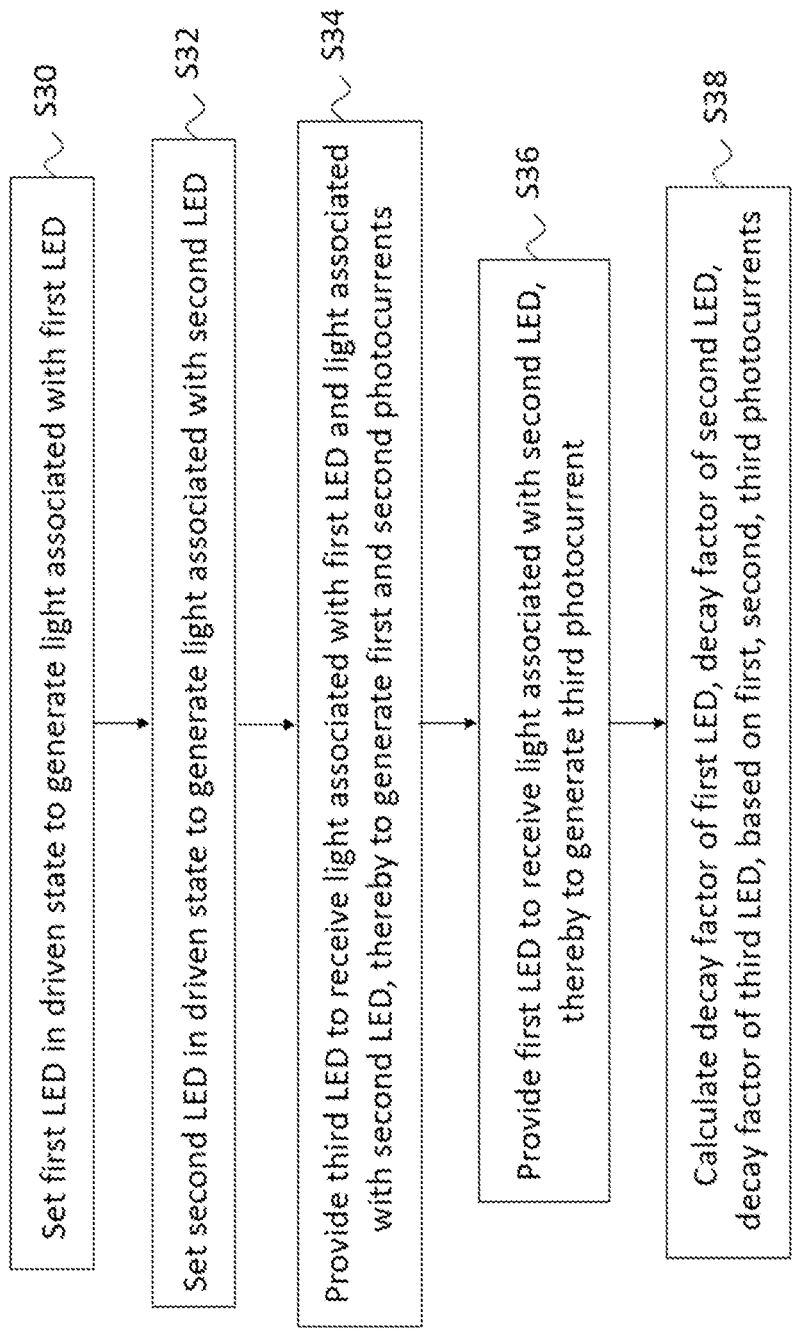
FIG. 2 is a flow chart of a method for testing a light-emitting unit, in accordance with an embodiment of the present invention.

Please refer to FIGS. 1 and 2 in conjunction. According to an embodiment of the present invention and with regard to a light-emitting unit 1, FIG. 1 is a block diagram of a device for testing the light-emitting unit 1, and FIG. 2 is a flow chart of a method for testing the same. As exemplified in FIG. 1, there may be at least three light-emitting diodes (LEDs) in the light-emitting unit 1; that is, the LED 10 (first LED), the LED 12 (second LED), and the LED 14 (third LED). The present embodiment does not restrict in any way the disposition of the light-emitting unit 1. The light-emitting unit 1 may stand alone, or it may be found within an array of light-emitting units, which in turn may be part of a LED display panel. In addition, what is depicted in FIG. 1 is but one of the arrangements of the LEDs 10, 12, and 14 in the light-emitting unit 1. A skilled person in the art may find other order or pattern of arrangement desirable, such as disposing the LED 10 between the LEDs 12 and 14. The present embodiment does not limit the number of LEDs in the light-emitting unit 1 to three, either. If part of a LED display panel, the light-emitting unit 1 may well have four or more LEDs.

In one example, a black matrix is appended to the periphery of the light-emitting unit 1 during the manufacturing process, shielding the LEDs 10, 12, and 14 from receiving light generated by other light-emitting units. The present embodiment does not necessitate the inclusion of a black matrix, of course. Even if the light-emitting unit 1 did receive light from other light-emitting units, that light would usually be of few lumens that the auto-testing of the light-emitting unit 1 was not affected. Meanwhile, the LEDs 10, 12, and 14 may be disposed on the same plane, so that none of the LEDs would stick out, cast shadows on the others, and hamper their generation of photocurrents. It is however also acceptable that the LEDs 10, 12, and 14 be disposed on different planes. For instance, the LEDs 10 and 12 may be on the same plane, while the LED 14 is disposed slightly lower.

In one example, the LEDs 10, 12, and 14 may be green, blue, and red, respectively. By modulating the electric currents driving these LEDs, the light-emitting unit 1 is able to generate light within the visible spectrum. In practice, the driving circuit 20 may be a circuit in the LED display panel configured to drive the light-emitting unit 1, and hence connected with the LEDs 10, 12, and 14 respectively and electrically. There is also in FIG. 1 a detection circuit 22 electrically and respectively connected to the LEDs 10 and 12, though the present embodiment allows for other arrangements. The detection circuit 22 may, for instance, be electrically connected to the LED 14. In the testing method as described in the present invention, the driving circuit 20 may be configured to drive the light-emitting unit 1, and the detection circuit 22 may be configured to record the photocurrents generated by the light-emitting unit 1. In one example, the detection circuit 22 is further connected with another electronic device that is capable of computation or data storage. Meanwhile, the present embodiment does not prescribe of what each of the LEDs 10, 12, and 14 is made. The LEDs 10, 12, and 14 may be based on gallium arsenide phosphide (GaAsP), indium gallium nitride (InGaN), gallium nitride (GaN), gallium phosphide (GaP), aluminium gallium indium phosphide (AlGaInP), aluminium gallium phosphide (AlGaP), or some other substance. In certain cases, one of the LEDs 10, 12, and 14 may be an organic light-emitting diode (OLED).

As spelt out in FIG. 2, in steps S30 and S32, the driving circuit 20 drives the LEDs 10 and 12, so that they are activated to emit light. The present embodiment does not prescribe the order in which the driving circuit 20 activates the LEDs 10 and 12. The driving circuit 20 may activate both at the same time, or it may drive the LED 10 before the LED 12. To lessen the workload of the detection circuit 22 (and to simplify the description hereinafter), the driving circuit 20 in common practice and in the present embodiment drives one of the LEDs 10 and 12 first and then the other. At any point in time, therefore, the light generated by the light-emitting unit 1, if any, is of a single color. Of course, the light-emitting unit 1 may alternatively generate polychromatic light whose bandwidth covers multiple colors, if for instance it includes a white LED.

The LED 14 receives the light emitted by the LED 10 and that by the LED 12 in step S34, and generates accordingly a first photocurrent and a second photocurrent. In one example, the driving circuit 20 activates first the LED 10; when the light from the LED 10 reaches the LED 14, the LED 14 generates the first photocurrent based on the photovoltaic effect. The driving circuit 20 then activates the LED 12; when the light from the LED 12 reaches the LED 14, the LED 14 generates the second photocurrent based on the photovoltaic effect. Assuming that the LEDs 10, 12, and 14 are green, blue, red, respectively, step S34 of the present embodiment may be expressed as $$I_{RG} \times L_G = K_1 \qquad (1)$$

$$I_{RB} \times L_B = K_2 \qquad (2)$$

The LED 14 might convert light of different colors at varying rates. $I_{RG}$ in equation (1) signifies the efficiency of the LED 14 (red LED) in converting green light to a photocurrent; in other words, $I_{RG}$ is the photocurrent conversion efficiency when the light emitted by the LED 10 (green LED) shines upon the LED 14. Meanwhile, $I_{RB}$ in equation (2) represents the efficiency of the LED 14 (red LED) in converting blue light to a photocurrent; in other words, $I_{RB}$ is the photocurrent conversion efficiency when the light emitted by the LED 12 (blue LED) shines upon the LED 14. Experiments have shown that the decay of the LED 14 affects $I_{RG}$ and $I_{RB}$ to much the same extent, and that the effect on $I_{RG}$ is directly proportional to the luminous efficiency of the LED 14. It can thus be concluded that both the photocurrent conversion and luminous efficiencies of the LED 14 decrease when the LED 14 decays, and that the decrease of the photocurrent conversion efficiency has less to do with the color temperature of the light that the LED 14 receives.

$L_G$ in equation (1) signifies in lumens the light emitted by the LED 10 and reaching the LED 14, whereas $L_B$ in equation (2) represents in lumens the light emitted by the LED 12 and reaching the LED 14. $K_1$ in equation (1) and $K_2$ in equation (2) express the first and second photocurrents, respectively, that the LED 14 generates. Please note that it is also possible that the LED 14 (red LED) receives light from the LED 10 (green LED) and the LED 12 (blue LED) simultaneously, giving rise to the following equation (a). In the physical sense, the response of a red LED to green light is unrelated to the presence of blue light (which means there is no $I_{RB} \times L_G$), and the response of the same to blue light is unrelated to the presence of green light (which means there is no $I_{RG} \times L_B$). When the LED 14 receives blue and green light at the same time, the result is equivalent to the summation of equations (1) and (2).

$$(I_{RG} + I_{RB}) \times (L_G + L_B) = K_1' \qquad (a)$$

To put it in another way: That the LED 14 receives light from the LEDs 10 and 12 simultaneously (as with equation (a)) does not concern the present embodiment. As long as the LED 14 subsequently receives light from either the LED 10 or the LED 12 (as with equation (1) or (2)), one can obtain the same mathematical result by subtracting one equation from another. For instance, subtracting equation (1) from equation (a) yields equation (2), and subtracting equation (2) from equation (a) yields equation (1).

In step S36, then, the LED 10 receives the light emitted by the LED 12, and generates accordingly a third photocurrent, or $$I_{GB} \times L_B = K_3 \quad (3)$$

$I_{GB}$ is the efficiency of the LED 10 in converting blue light to a photocurrent; in other words, $I_{GB}$ is the photocurrent conversion efficiency when the light emitted by the LED 12 shines upon the LED 10. $L_B$ expresses in lumens the light emitted by the LED 12 and reaching the LED 10, whereas $K_3$ signifies the third photocurrent. In one example, step S36 comes before step S30 or S32. Please note that a LED's photocurrent is smaller than its driving current; the difference between the currents lies in the characteristics of the semiconductor chosen, and may reach several orders of magnitude. It is not straightforward in practice to detect photocurrents in an activated LED that is emitting light; therefore, steps S30 and S36 are usually not performed concurrently. Nevertheless, one cannot reject the possibility that some of the present embodiment's steps may take place at the same time. Suitable semiconducting material, additional instruments, or instruments with superior performance can always be anticipated.

In practice, decay happens to every LED of some wear, and manifests itself on two levels: the LED's luminous efficiency and photocurrent conversion efficiency. In one example, steps S30 through S36 are repeated after an elapse of time. Assuming $\alpha$, $\beta$, and $\gamma$ to be the decay factors of the LEDs 10, 12, and 14, respectively, equations (1) through (3) may be rewritten as $$\gamma I_{RG} \times \alpha L_G = K_4 \quad (4)$$

$$\alpha I_{GB} \times \beta L_B = K_6 \quad (5)$$

$$\gamma I_{RB} \times \beta L_B = K_5 \quad (6)$$

$K_4$ in equation (4) and $K_5$ in equation (5) denote a fourth photocurrent and a fifth photocurrent, respectively, that the LED 14 generates, while $K_6$ in equation (6) signifies a sixth photocurrent generated by the LED 10. Physically speaking, in lumens $\alpha L_G$ expresses the light emitted by the LED 10 and reaching the LED 14, multiplied by the decay factor $\alpha$, a scalar such as a ratio or percentage. If for instance $L_G$ is 10 lumens and $\alpha L_G$, that which the decaying LED 10 actually provides, is 9 lumens, then $\alpha$ is 90%. In the same vein, $\alpha I_{GB}$ is the photocurrent conversion efficiency when the light emitted by the LED 12 shines upon the decaying LED 10, $\alpha$ being a scalar such as a ratio or percentage.

One can obtain the following by organizing equations (1) through (6):

$$\gamma \alpha K_1 = K_4 \quad (7)$$

$$\gamma \beta K_2 = K_5 \quad (8)$$

$$\alpha \beta K_3 = K_6 \quad (9)$$

$K_1$ through $K_6$ are all measurements the detection circuit 22 taken of the photocurrents. Based on the first photocurrent $K_1$, the second photocurrent $K_2$, and the third photocurrent $K_3$, and substituting in the fourth photocurrent $K_4$, the fifth photocurrent $K_5$, and the sixth photocurrent $K_6$, the detection circuit 22 may in step S38 swiftly calculate and obtain $\alpha$, $\beta$, and $\gamma$, the decay factors of the LEDs 10, 12, and 14, respectively. With regard to the present embodiment, $\alpha$, $\beta$, and $\gamma$ signifies the varying degrees of decay that befall the LEDs within a period of time. The period starts at the point when the detection circuit 22 measures the photocurrents $K_2$, and $K_3$, and ends at the point when the detection circuit 22 measures the photocurrents $K_4$, $K_5$, and $K_6$. Neither the LEDs' efficiencies in photocurrent conversion (e.g. $I_{RG}$, $I_{RB}$, and $I_{GB}$), nor the amounts of light the LEDs emit (in lumens, e.g. $L_G$ and $L_B$), need to be known in the present embodiment. The detection circuit 22 calculates the decay factors by taking measurements of the photocurrents, realizing the objective of auto-testing the light-emitting unit 1 by making use of the LEDs therein.

Hitherto the present embodiment is described as having the detection circuit 22 measure the photocurrents again after an elapse of time, though please note that this may not necessarily be the case. In another example, a testing method of the present invention does not require a repeat measurement by the detection circuit 22 of the photocurrents. If for instance the LEDs' initial, out-of-factory efficiencies in photocurrent conversion (e.g. $I_{RG}$, $I_{RB}$, and $I_{GB}$) and in light generation (in lumens, e.g. $L_G$ and $L_B$) are known, the detection circuit 22 can report, right after it first measures the photocurrents $K_1$, $K_2$, and $K_3$, the decays factors of the LEDs at that moment. One may then obtain the following by organizing equations (1) through (3):

$$\gamma \alpha C_1 = K_1 \quad (10)$$

$$\gamma \beta C_2 = K_2 \quad (11)$$

$$\alpha \beta C_3 = K_3 \quad (12)$$

$C_1$ in equation (10) is the known product of $I_{RG} \times L_G$, as is $C_2$ in equation (11) of $I_{RB} \times L_B$ and $C_3$ in equation (12) of $I_{GB} \times L_B$. Here $\alpha$, $\beta$, and $\gamma$ represents the varying degrees of decay that befall the LEDs within a period of time. The period starts at the point when the LEDs leave the factory, and ends at the point when the detection circuit 22 measures the photocurrents $K_1$, $K_2$, and $K_3$. The detection circuit 22 calculates $\alpha$, $\beta$, and $\gamma$, the decay factors of the LEDs relative to when they were shipped out of the factory, by taking measurements of the photocurrents, realizing the objective of auto-testing the light-emitting unit 1 by making use of the LEDs therein. The present embodiment does not prescribe how the initial luminous or photocurrent conversion efficiencies are obtained. Those numbers, along with other properties of the LEDs, may be found in the manufacturer's specifications or statistical summary. Alternatively, one may treat steps S30 through S36 as a pre-testing procedure.

Figure 3:
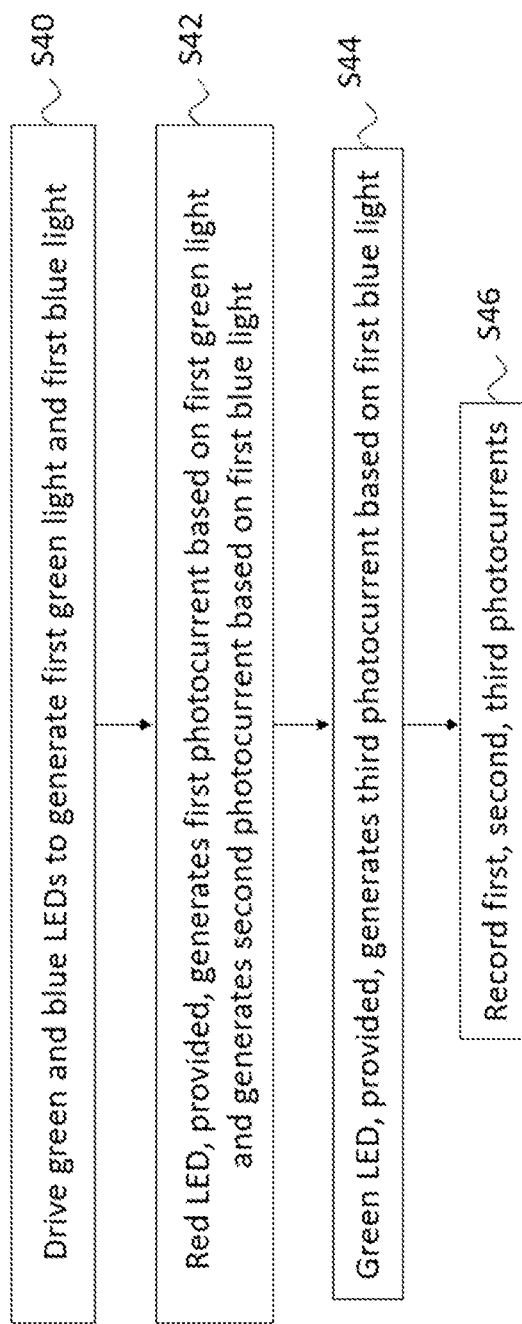
FIG. 3 is a flow chart of a method for testing a light-emitting unit, in accordance with another embodiment of the present invention.
Figure 4:
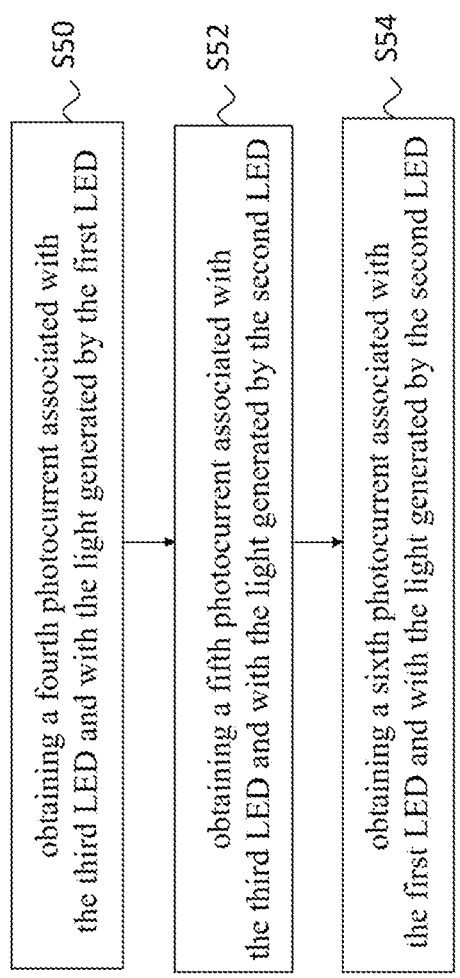
FIG. 4 is a flow chart of a method for testing a light-emitting unit, in accordance with another embodiment of the present invention.

For further illustration of the present invention, consider an embodiment where a light-emitting unit includes a red LED, a green LED, and a blue LED. Please refer to FIGS. 1 and 3 in conjunction. According to the present embodiment, FIG. 3 is a flow chart of a method for testing the light-emitting unit 1. As depicted in the figures, the driving circuit 20 drives in step S40 the LED 10 and the LED 12 to generate a first green light ($L_G$ in equation (1)) and a first blue light ($L_B$ in equations (2) and (3)). Provided in step S42, the LED 14 generates a first photocurrent based on the first green light (i.e. equation (1)) and a second photocurrent based on the first blue light (i.e. equation (2)). Provided in step S44, the LED 10 generates a third photocurrent based on the first blue light (i.e. equation (3)). The detection circuit 22, here electrically connected to the LED 10 and the LED 14, then records the first, second, and third photocurrents in step S46.

After being in use for a while, the LED 10 and the LED 12 may be driven again by the driving circuit 20 to generate a second green light ($\alpha L_G$ in equation (4)) and a second blue light ($\beta L_B$ in equations (5) and (6)). The LED 14 is provided to generate a fourth photocurrent based on the second green light (i.e. equation (4)) and a fifth photocurrent based on the second blue light (i.e. equation (5)). The LED 10 in turn is provided to generate a sixth photocurrent based on the second blue light (i.e. equation (6)). The fourth, fifth, and sixth photocurrents are then recorded. Based on the first, second, third, fourth, fifth, and sixth photocurrents, a decay factor of the light emitting unit 1 is calculated, in accordance with the aforesaid equations (7) through (9). The present embodiment is invoked for the reader's convenience; for detailed description thereof, please refer to the previous embodiment.

To summarize: The method provided by the present invention implements a light-emitting unit's auto-testing by exploiting the device properties of the LEDs therein; specifically, by measuring photocurrents to determine the decay factor of each of the LEDs.

What is claimed is:

1. A method for testing a light-emitting unit, the light-emitting unit at least having a first LED, a second LED, and a third LED, the method comprising:
    setting the first LED in a driven state to generate light associated with the first LED;
    setting the second LED in a driven state to generate light associated with the second LED;
    providing the third LED to receive the light associated with the first LED and the light associated with the second LED, and thereby to generate a first photocurrent ($K_1$) and a second photocurrent ($K_2$);
    providing the first LED to receive the light associated with the second LED, and thereby to generate a third photocurrent ($K_3$);
    calculating a decay factor of the first LED ($\alpha$), a decay factor of the second LED ($\beta$), and a decay factor of the third LED ($\gamma$), based on the first photocurrent ($K_1$), the second photocurrent ($K_2$), and the third photocurrent ($K_3$);
    obtaining a fourth photocurrent ($K_4$) associated with the third LED and with the light generated by the first LED;
    obtaining a fifth photocurrent ($K_5$) associated with the third LED and with the light generated by the second LED; and
    obtaining a sixth photocurrent ($K_6$) associated with the first LED and with the light generated by the second LED,
    wherein calculating the decay factor ($\alpha$) of the first LED, the decay factor ($\beta$) of the second LED, and the decay factor ($\gamma$) of the third LED is further based on the fourth photocurrent ($K_4$), the fifth photocurrent ($K_5$), and the sixth photocurrent ($K_6$),
    wherein a relation between the first to six photocurrent ($K_1$ to $K_6$) and the decay factors ($\alpha$, $\beta$, and $\gamma$) of the first to third LED is as follows:

$\gamma \alpha K_1 = K_4$ $\gamma \beta K_2 = K_5$ $\alpha \beta K_3 = K_6$

2. The method for testing the light-emitting unit according to claim 1, wherein the first LED has a first luminous efficiency, the second LED has a second luminous efficiency, and the third LED has a third luminous efficiency.

3. The method for testing the light-emitting unit according to claim 2, wherein the first LED has a first conversion efficiency with regard to the light associated with the second LED, the third LED has a second conversion efficiency with regard to the light associated with the first LED, and the third LED has a third conversion efficiency with regard to the light associated with the second LED.

4. The method for testing the light-emitting unit according to claim 3, wherein the decay factor of the first LED affects the first luminous efficiency and the first conversion efficiency, the decay factor of the second LED affects the second luminous efficiency, and the decay factor of the third LED affects the third luminous efficiency, the second conversion efficiency, and the third conversion efficiency.

5. A method for testing at least one red LED, a green LED, and a blue LED in a light-emitting unit, the method comprising:
    driving the green LED and the blue LED to generate a first green light and a first blue light;
    providing the red LED, the red LED generating a first photocurrent ($K_1$) based on the first green light and generating a second photocurrent ($K_2$) based on the first blue light;
    providing the green LED, the green LED generating a third photocurrent ($K_3$) based on the first blue light;
    recording the first photocurrent ($K_1$), the second photocurrent ($K_2$), and the third photocurrent ($K_3$);
    driving, after an elapse of time, the green LED and the blue LED again to generate a second green light and a second blue light;
    providing the red LED, the red LED generating a fourth photocurrent ($K_4$) based on the second green light and generating a fifth photocurrent ($K_5$) based on the second blue light;
    providing the green LED, the green LED generating a sixth photocurrent ($K_6$) based on the second blue light;
    recording the fourth photocurrent ($K_4$), the fifth photocurrent ($K_5$), and the sixth photocurrent ($K_6$); and
    calculating a decay factor ($\alpha$, $\beta$, or $\gamma$) of the light-emitting unit based on the first photocurrent ($K_1$), the second photocurrent ($K_2$), the third photocurrent ($K_3$), the fourth photocurrent ($K_4$), the fifth photocurrent ($K_5$), and the sixth photocurrent ($K_6$),
    wherein a relation between the first to six photocurrent ($K_1$ to $K_6$) and the decay factor ($\alpha$, $\beta$ or $\gamma$) of the light-emitting unit is as follows:

$\gamma \alpha K_1 = K_4$ $\gamma \beta K_2 = K_5$ $\alpha \beta K_3 = K_6$.

* * * * *